March 12, 1968 R. M. LETSINGER 3,373,370
TRANSISTOR CIRCUIT ARRANGEMENT
Filed May 20, 1965
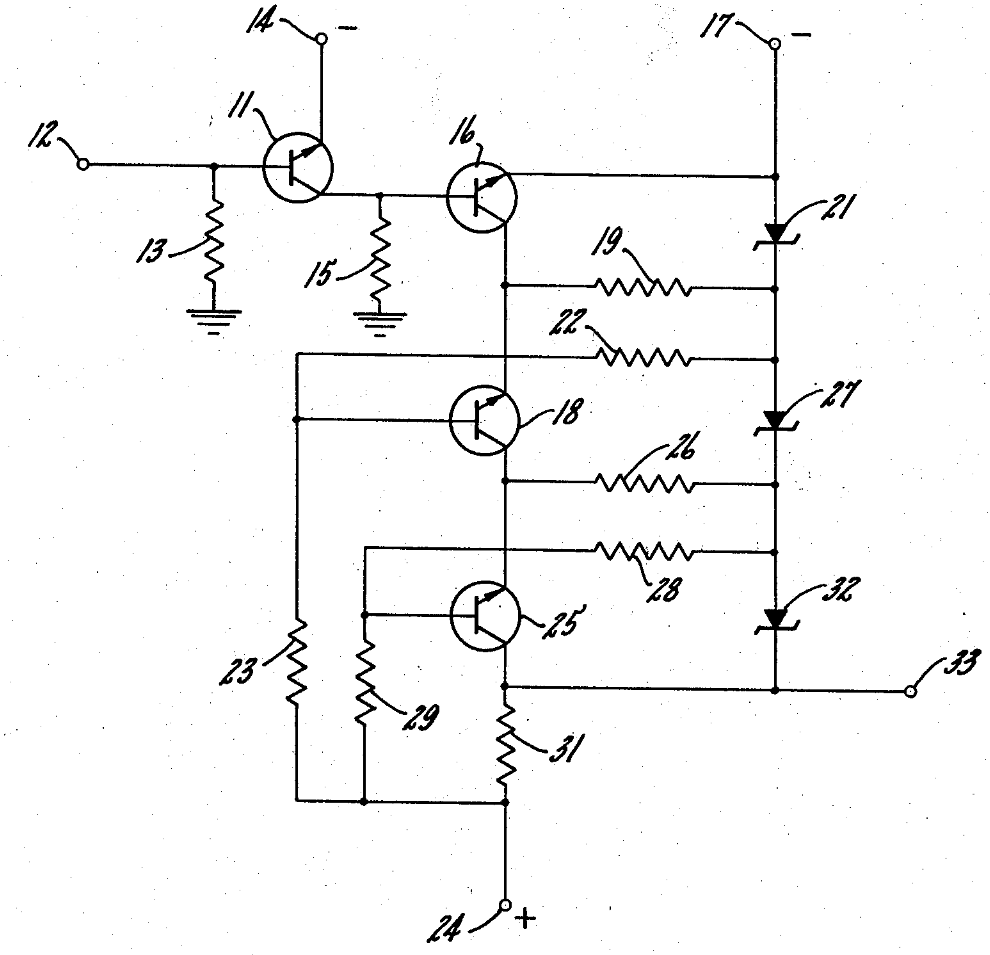
INVENTOR.
Robert M. Letsinger,
BY H. H. Losche
Att'ys.

3,373,370
TRANSISTOR CIRCUIT ARRANGEMENT

Robert M. Letsinger, Greenfield, Ind., assignor to the United States of America as represented by the Secretary of the Navy Filed May 20, 1965, Ser. No. 457,531
9 Claims. (Cl. 330—24)

ABSTRACT OF THE DISCLOSURE

A solid state, high voltage direct current amplifier circuit utilizing a plurality of commercially available transistors which are series energized and which have the emitter and collector electrodes thereof coupled in circuit with various resistance elements and in parallel with respective Zener diodes. These Zener diodes determine the transition points at which the level of conduction of one transistor becomes stabilized and at which any further increases in conduction are passed on to the following transistor. The transistors are also protected by these diodes in a manner which permits the use of transistors having individual maximum voltage ratings lower than the anticipated output voltages of the amplifier.

The invention described herein may be manufactured and used by or for the Government of the United States of America for governmental purposes without the payment of any royalties thereon or therefor.

The present invention is generally related to amplifier circuitry, and more specifically to completely solid state, high voltage, direct current amplifier circuitry.

As the use of various forms of video systems in aerospace and missile applications rapidly increases, a need often arises for a completely solid state direct current (D.C.) amplifier circuit capable of providing relatively high voltage amplitudes with a high degree of reliability. Most solid state D.C. amplifier circuits of the prior art have been relatively low voltage amplitude devices incapable of providing amplification in the hundreds-of-volts region. The present invention satisfies this need by utilizing novel coupling of Zener diodes in association with transistors and resistive elements to provide a protected, completely solid state, relatively high voltage D.C. amplifier.

An object of the present invention is the provision of a solid state D.C. amplifier circuit.

Another object is to provide a reliable, completely solid state D.C. amplifier circuit capable of producing relatively high voltage amplitudes.

A further object of the invention is the provision of a reliable, completely solid state D.C. amplifier circuit capable of producing relatively high voltage amplitudes while utilizing presently available, commercial transistors whose individual maximum voltage ratings are relatively lower than anticipated output voltages of the amplifier.

Other objects, advantages, and novel features of the invention will become apparent from the following detailed description of the invention when considered in conjunction with the accompanying figure of drawing which schematically presents one embodiment of the invention.

Referring now to the figure of drawing, there is shown an inverting input transistor 11 which has its base electrode coupled to an input terminal 12 and via a resistance 13 to ground potential, its emitter electrode coupled to a source of negative direct current potential 14, and its collector electrode coupled to ground potential via a resistance 15 and to the base electrode of a first amplifying transistor 16. Transistor 16 has its emitter electrode coupled to a source of negative direct current potential 17 and its collector electrode coupled to the emitter electrode of a second amplifying transistor 18, and via a resistance 19 to the cathode electrode of a Zener diode 21. Diode 21 has its anode electrode coupled to potential source 17. The base electrode of transistor 18 is coupled via resistance 22 to the cathode electrode of diode 21, and via a resistance 23 to a source of positive direct current potential 24. The collector electrode of transistor 18 is coupled to the emitter electrode of a third amplifying transistor 25, and via a resistance 26 to the cathode electrode of a Zener diode 27, which has its anode electrode coupled to the cathode electrode of diode 21. The base electrode of transistor 25 is coupled via a resistance 28 to the cathode electrode of diode 27, and via a resistance 29 to potential source 24. The collector electrode of transistor 25 is coupled via a resistance 31 to potential source 24, and to the cathode electrode of a Zener diode 32. An output terminal 33 is coupled to the collector electrode of transistor 25.

An embodiment of the invention as shown in the figure of drawing has been constructed and satisfactorily tested as a D.C. amplifier for an automatic gain control circuit utilizing the following values and components:

| | | |
|---|---|---|
| Transistor 11 | | 2N1613 |
| Transistors 16, 18, and 25 | | 2N657 |
| Zener diodes 21, 27, and 32 | | 1N3043B |
| Resistance 13 | ohms | 150,000 |
| Resistance 15 | do | 75,000 |
| Resistances 19, 22, 26, and 28 | do | 10,000 |
| Resistances 23 and 29 | do | 1,000,000 |
| Resistance 31 | do | 100,000 |
| D.C. potential sources 14 and 17 | volts | —24 |
| D.C. potential source 24 | do | +300 |

It is to be understood that these particular components and values are presented only for illustrative purposes and are not intended to limit the scope of the invention in any way.

*Operation*

With regard to the figure of drawing, the operation of the invention occurs in the following manner. Initially it will be assumed that the invention is in its "OFF" or quiescent condition, i.e., with all necessary supply voltages present, but with no positive D.C. signal to be amplified being applied to the base electrode of transistor 16. In this "OFF" condition, transistor 16 will be nonconducting and transistors 18 and 25 will be conducting at a very low level. The Zener voltages of diodes 21, 27, and 32 will be exceeded and current will thus flow from source 24, through these diodes in a backward direction, to source 17, the diodes thereby protecting transistors 16, 18, and 25 from any dangerous over-voltage during this "OFF" condition. Upon application of a positive D.C. signal to be amplified, via input terminal 12 and transistor 11, to the base electrode of transistor 16, the "turn-on" sequence begins and transistor 16 begins to conduct causing a drop in the emitter potential of transistor 18 and an increase in the base drive current thereof enabling transistor 18 to increase its level of conduction. This increased conduction through transistor 18 causes a drop in the emitter potential of transistor 25 resulting in increased conduction therethrough, and the amplified D.C. output signal is provided at output terminal 33 from the collector of transistor 25. As the input signal applied to the base electrode of transistor 16 increases in magnitude, transistor 25 will continue to increase its level of conduction, thereby reducing current flow through Zener diode 32 until the potential thereacross falls below its Zener voltage and diode 32 then ceases to conduct. As the magnitude of the input signal continues to increase, the level of conduction of transistor 18 increases causing a decrease in the current flow through Zener diode 27 until the potential across it falls below its Zener voltage causing diode 27 to cease conduction. As the magnitude of the input signal is increased still further, the level of conduction of transistor 16 will increase causing a decrease in the current flow through Zener diode 21 until the potential across that diode falls below its Zener voltage thereby causing it to cease conduction. With the magnitude of the D.C. input signal at this relatively high level the "turn-on" sequence will have been completed and Zener diodes 21, 27, and 32 will be nonconducting since the reverse bias across each does not exceed its Zener voltage due to the relatively high level of conduction of transistors 16, 18, and 25. The desired amplified, high voltage output signal is available at output terminal 33.

As the magnitude of the D.C. input signal decreases from this relatively high level back to a low level quiescent condition, essentially a reverse of the "turn-on" sequence occurs. First, the level of conduction of transistor 16 will decrease due to the decrease in positive potential at its base electrode. This produces a rise in potential across diode 21, and when this potential reaches its Zener voltage, diode 21 begins to conduct via resistance 19. This lowers the potential at the base electrode of transistor 18 reducing its level of conduction thereby causing the potential across diode 27 to rise, and when this rising potential exceeds its Zener voltage, diode 27 begins to conduct via resistance 26 causing a decrease in the potential at the base electrode of transistor 25, reducing its level of conduction. This causes the potential across Zener diode 32 to rise, and when this rising potential exceeds its Zener voltage, diode 32 will begin to conduct and the invention will have returned to its quiescent state.

In this novel transistor-Zener diode D.C. amplifier circuit, the Zener diodes perform dual functions. They determine the transition points at which the level of conduction of one transistor becomes stabilized and at which any further increases in conduction are passed on to another succeeding transistor. In addition, they protect their associated transistors from any damage due to possible excessive supply voltages. The diodes will produce steps in the output voltage waveform as the Zener voltage of each diode is crossed. In the embodiment of the invention constructed and satisfactorily tested as a D.C. amplifier for an automatic gain control circuit, these steps were not found to be objectionable; however, this effect might need to be considered for some other applications.

Thus it becomes apparent from the foregoing description and annexed drawing that the invention, a reliable, completely solid state D.C. amplifier circuit capable of relatively high voltage amplification, is a useful and practical device having many applications in the area of solid state D.C. amplifier circuitry.

Obviously many modifications and variations of the present invention are possible in the light of the above teachings. For example, input transistor 11 was utilized with the invention for a particular application and may be found to be unnecessary for many other applications; also, more stages of amplification than the three shown in the figure of drawing may be utilized depending upon the amplification required and the individual voltage ratings of commercially available transistors. It is therefore to be understood that within the scope of the appended claims the invention may be practiced otherwise than as specifically described.

I claim:

1. An amplifier circuit comprising:

input means for receiving a signal to be amplified;

a first amplification means having a control electrode and first and second conduction electrodes, said control electrode thereof being coupled to said input means to receive therefrom said signal to be amplified, and said first conduction electrode thereof being coupled to a first source of direct current potential;

a second amplification means having a control electrode and first and second conduction electrodes, said control electrode thereof being resistively coupled to a second source of direct current potential, and said first conduction electrode thereof being coupled to said second conduction electrode of said first amplification means;

a third amplification means having a control electrode and first and second conduction electrodes, said control electrode thereof being resistively coupled to said second source of direct current potential, said first conduction electrode thereof being coupled to said second conduction electrode of said second amplification means, and said second conduction electrode thereof being resistively coupled to said second source of direct current potential;

a first amplification control and protection means having a first terminal thereof coupled to said first source of direct current potential, and having a second terminal thereof resistively coupled to said second conduction electrode of said first amplification means and also resistively coupled to said control electrode of said second amplification means;

a second amplification control and protection means having a first terminal thereof coupled to said second terminal of said first amplification control and protection means, and having a second terminal thereof resistively coupled to said second conduction electrode of said second amplification means and also resistively coupled to said control electrode of said third amplification means;

a third amplification control and protection means having a first terminal thereof coupled to said second terminal of said second amplification control and protection means, and having a second terminal thereof coupled to said second conduction electrode of said third amplification means; and output means for providing an amplified signal thereat coupled to said second conduction electrode of said third amplification means.

2. An amplifier circuit as set forth in claim 1 wherein said first, second, and third amplification means comprise transistors and said control electrodes, said first conduction electrodes, and said second conduction electrodes thereof correspond to base, emitter, and collector electrodes, respectively.

3. An amplifier circuit as set forth in claim 1 wherein said first, second, and third amplification control and protection means comprise Zener diodes and said first and second terminals thereof correspond to anode and cathode electrodes, respectively.

4. An amplifier circuit as set forth in claim 2 wherein said first, second, and third amplification control and protection means comprises Zener diodes and said first and second terminals thereof correspond to anode and cathode electrodes respectively.

5. A high voltage direct current amplifier circuit comprising:

input means for receiving a direct current signal to be amplified;

a first amplification means having a control electrode and first and second conduction electrodes, said control electrode thereof being coupled to said input means to receive therefrom said direct current signal to be amplified, and said first conduction electrode thereof being coupled to a first source of direct current potential;

a second amplification means having a control electrode and first and second conduction electrodes, said control electrode thereof being resistively coupled to a second source of direct current potential, and said first conduction electrode thereof being coupled to said second conduction electrode of said first amplification means;

a third amplification means having a control electrode and first and second conduction electrodes, said control electrode thereof being resistively coupled to said second source of direct current potential, said first conduction electrode thereof being coupled to said second conduction electrode of said second amplification means, and said second conduction electrode thereof being resistively coupled to said second source of direct current potential;

a first amplification control and protection means having a first terminal thereof coupled to said first source of direct current potential, and having a second terminal thereof resistively coupled to said second conduction electrode of said first amplification means and also resistively coupled to said control electrode of said second amplification means;

a second amplification control and protection means having a first terminal thereof coupled to said second terminal of said first amplification control and protection means, and having a second terminal thereof resistively coupled to said second conduction electrode of said second amplification means and also resistively coupled to said control electrode of said third amplification means;

a third amplification control and protection means having a first terminal thereof coupled to said second terminal of said second amplification control and protection means, and having a second terminal thereof coupled to said second conduction electrode of said third amplification means; and output means for providing an amplified signal thereat coupled to said second conduction electrode of said third amplification means.

6. A high voltage direct current amplifier circuit as set forth in claim 5 wherein said first, second, and third amplification means comprise transistors and said control electrodes, said first conduction electrodes, and said second conduction electrodes thereof correspond to base, emitter, and collector electrodes, respectively.

7. A high voltage direct current amplifier circuit as set forth in claim 5 wherein said first, second, and third amplification control and protection means comprise Zener diodes and said first and second terminals thereof correspond to anode and cathode electrodes, respectively.

8. A high voltage direct current amplifier circuit as set forth in claim 6 wherein said first, second, and third amplification control and protection means comprise Zener diodes and said first and second terminals thereof correspond to anode and cathode electrodes, respectively.

9. A completely solid state, high voltage direct current amplifier circuit comprising:

input means for receiving a direct current signal to be amplified;

a first transistor amplification means having base, emitter, and collector electrodes, said base electrode thereof being coupled to said input means to receive therefrom said direct current signal to be amplified, and said emitter electrode thereof being coupled to a first source of direct current potential;

a second transistor amplification means having base, emitter, and collector electrodes, said base electrode thereof being resistively coupled to a second source of direct current potential, and said emitter electrode thereof being coupled to said collector electrode of said first amplification means;

a third transistor amplification means having base, emitter, and collector electrodes, said base electrode thereof being resistively coupled to said second source of direct current potential, said emitter electrode thereof being coupled to said collector electrode of said second transistor amplification means, and said collector electrode thereof being resistively coupled to said second source of direct current potential;

a first Zener diode amplification control and protection means having its anode electrode coupled to said first source of direct current potential, and having its cathode electrode resistively coupled to said collector electrode of said first transistor amplification means and also resistively coupled to said base electrode of said second transistor amplification means;

a second Zener diode amplification control and protection means having its anode electrode coupled to said cathode electrode of said first Zener diode amplification control and protection means, and having its cathode electrode resistively coupled to said collector of said second transistor amplification means and also resistively coupled to said base electrode of said third transistor amplification means;

a third Zener diode amplification control and protection means having its anode electrode coupled to said cathode electrode of said second Zener diode amplification control and protection means, and having its cathode electrode coupled to said collector electrode of said third transistor amplification means; and output means for providing an amplified signal thereat coupled to said collector electrode of said third transistor amplification means.

References Cited

UNITED STATES PATENTS

| | | | |
|---|---|---|---|
| 3,202,904 | 8/1965 | Madland | 307—88.5 X |
| 3,237,155 | 2/1966 | Brockett | 330—24 X |

ROY LAKE, *Primary Examiner.*

L. J. DAHL, *Assistant Examiner.*